United States Patent [19]

Matsuda

[11] Patent Number: 5,434,939
[45] Date of Patent: Jul. 18, 1995

[54] OPTICAL FIBER MODULE WITH SURFACE EMITTING LASER

[75] Inventor: Kenichi Matsuda, Moriguchi, Japan

[73] Assignee: Matsushita Electric Industrial Co., Ltd., Kadoma, Japan

[21] Appl. No.: 193,448

[22] Filed: Feb. 8, 1994

[30] Foreign Application Priority Data

Feb. 9, 1993 [JP] Japan .................. 5-020993

[51] Int. Cl.⁶ .................................. G02B 6/36
[52] U.S. Cl. .............................. 385/88; 257/79; 257/80; 257/116; 385/92
[58] Field of Search .................. 385/88-94, 385/33, 14; 372/50; 257/117, 79, 80, 116, 680, 95, 777, 192

[56] References Cited

U.S. PATENT DOCUMENTS

| | | | |
|---|---|---|---|
| 4,326,771 | 4/1982 | Henry et al. | 385/92 |
| 4,368,481 | 1/1983 | Ohashi et al. | 257/116 |
| 4,826,272 | 5/1989 | Pimpinella et al. | 385/92 |
| 5,285,087 | 2/1994 | Narita et al. | 257/192 |

FOREIGN PATENT DOCUMENTS

| | | | |
|---|---|---|---|
| 54-221184 | 2/1979 | Japan | 257/79 |
| 61-220383 | 9/1986 | Japan | 257/80 |
| 2-1805 | 1/1990 | Japan | 385/92 |

*Primary Examiner*—Rodney B. Bovernick
*Assistant Examiner*—John Ngo
*Attorney, Agent, or Firm*—Ratner & Prestia

[57] ABSTRACT

An optical fiber module comprises a light-emitting chip based on a semiconductor substrate, a vertical cavity surface emitting laser formed on a primary plane of the light-emitting chip, a guiding hole opened on a secondary plane of the light-emitting chip, and an optical fiber stuck to the secondary plane of the light-emitting chip. The position of the guiding hole is aligned to that of the surface emitting laser, and the guiding hole is close to the surface emitting laser. By inserting a tip of the optical fiber into the guiding hole, the optical fiber is coupled optically to the surface emitting laser only with mechanical positioning. The light-emitting chip is mounted on an electronic circuit board with the primary plane attached to it. Since the optical fiber is taken out from a secondary plane of the light-emitting chip, the assembly of the optical fiber module is simply done by coupling an optical fiber to the light-emitting chip after the light-emitting chip is attached to the electronic circuit board bonded on a package.

6 Claims, 4 Drawing Sheets

OPTICAL FIBER MODULE WITH SURFACE EMITTING LASER

BACKGROUND OF THE INVENTION

This invention relates to an optical fiber module including a vertical cavity surface emitting laser which is coupled optically to an optical fiber with mechanical positioning.

Edge emitting semiconductor lasers are generally used in optical fiber modules at present. Since an edge emitting laser has a wide radiation angle, a lens should be inserted between the laser and an optical fiber to obtain high efficiency in optical coupling. Precise optical alignment is required for the laser, the lens, and the optical fiber in assembling the module. The alignment is usually done by operating the laser to emit a laser ray. The optical fiber is fixed at the point where output optical power from the far end of the optical fiber takes the maximum. This method causes low throughput since driving current should be applied to the laser during the assembly. Relatively long working time is required for alignment even if an automated optical-axis aligner is utilized. These factors limit the cost reduction of optical fiber modules. To avoid them, several alignment methods based on mechanical positioning have been proposed though the coupling efficiencies are usually low.

On the other hand, it has been proposed to apply vertical cavity surface emitting lasers to optical fiber modules. The performance of the surface emitting lasers has made rapid progress recently. Since the surface emitting lasers have narrow radiation angles, high efficiency can be expected even for direct optical coupling without lenses. The direct coupling of a surface emitting laser and an optical fiber is described, for example, in K. Tai et al., "Selfaligned fiber pigtailed surface emitting lasers on Si submounts," Electronics Letters, vol. 27, pp. 2030–2032 (1991) which is incorporated herein by reference. In this example, mechanical positioning of an optical fiber is attained by using a guiding hole opened in a Si submount. As shown in FIG. 4, a vertical cavity surface emitting laser 401 is formed on a light-emitting chip 402. The light-emitting chip 402 is attached to a Si submount 403. The submount 403 has a guiding hole 404 where an optical fiber 405 is inserted and fixed. The optical fiber 405 is coupled optically to a surface emitting laser 401.

The steps for aligning the surface emitting laser 401 and the optical fiber 405 are as follows. First in bumps aligned to the guiding hole 404 are formed on the submount 403. Second in bumps aligned to the surface emitting laser 401 are formed on the light-emitting chip 402. By bonding the first and the second in bumps with tension between them, the light-emitting chip 402 and the submount 403 are self-aligned. As a result, the positions of the surface emitting laser 401 and the guiding hole 404 are adjusted. Then the optical fiber 405 is inserted to the guiding hole 404 and fixed with UV cured epoxy 406, which results in the final alignment between the surface emitting laser 401 and the optical fiber 405. The surface emitting laser 401 is connected electrically to an external circuit with an n-side wire 407 bonding to the light-emitting chip 402 and with a p-side wire 408 bonding to the submount 403. By using this method, a coupling efficiency of approximately 100% is attained for a multimode optical fiber.

The method described above has an advantage that high coupling efficiency can be obtained without driving the laser during assembly. However, it is difficult to attach the submount to a package since the light-emitting chip is mounted on one side of the submount while the optical fiber is fixed to the other side. In general, the submount is attached to the package before the light-emitting chip is mounted on the submount. In this case, the floor of the package as well as the submount has a hole through which the optical fiber is inserted. In the other case where the optical fiber is taken out upward as shown in FIG. 4, the submount may be attached to the package with the light-emitting chip beneath it. A special package with a concave housing the light-emitting chip is desirably used in this configuration. In both cases, a special package with a through hole or a concave shape is required which is more expensive than a conventional package with a flat floor.

SUMMARY OF THE INVENTION

In a first embodiment, an optical fiber module comprises a light-emitting chip based on a semiconductor substrate, a vertical cavity surface emitting laser formed on a primary plane of the light-emitting chip, a guiding hole opened on a secondary plane of the light-emitting chip (i.e., formed opposite to the laser), and an optical fiber coupled to the secondary plane of the light-emitting chip. The position of the guiding hole is aligned to that of the surface emitting laser (i.e. adjacent/opponent thereto), and the guiding hole reaching close by the surface emitting laser. By inserting a tip of the optical fiber to the guiding hole, the optical fiber is coupled optically to the surface emitting laser. The alignment between the surface emitting laser and the guiding hole is achieved, for example, by using a method described in the third embodiment.

In the first embodiment, the light-emitting chip is mounted on an electronic circuit board with the primary plane attached to it. The electronic circuit board is either a printed board with interconnection metal patterns or an IC chip with a Si or GaAs substrate. The light-emitting chip and the electronic circuit board have electrical contacts for connecting the surface emitting laser electrically to the electronic circuit board. In this configuration, the primary plane of the light-emitting chip is attached to the electronic circuit board, while the optical fiber is taken out from a secondary plane of the light-emitting chip. The assembly of the optical fiber module is simple since the optical fiber can be coupled to the light-emitting chip after the light-emitting chip is attached to the electronic circuit board bonded on a package.

In a second embodiment, an optical fiber module comprises an electronic circuit board, a light-emitting chip based on a semiconductor substrate, a vertical cavity surface emitting laser formed on the primary plane of the light-emitting chip, and a heterojunction bipolar transistor stacked on the surface emitting laser. The light-emitting chip is mounted on the electronic circuit board with a primary plane of the light-emitting chip attached to the electronic circuit board. The surface emitting laser has an anode connected directly to the semiconductor substrate. The collector of the heterojunction bipolar transistor is connected directly to the cathode of the surface emitting laser. The light-emitting chip and the electronic circuit board have electrical contacts for connecting the emitter and the base of the heterojunction bipolar transistor and the anodes of the surface emitting laser electrically to the electronic circuit board.

Compared with the first embodiment, the second embodiment has merit that the modulation current for the surface emitting laser can be reduced since the heterojunction bipolar transistor amplifies the current. In regard to the optical alignment, the same configuration as the first embodiment can be utilized. This is because the heterojunction bipolar transistor is stacked on the surface emitting laser, and a laser ray is emitted toward the semiconductor substrate. A guiding hole is opened on a secondary plane of the light-emitting chip, and an optical fiber is stuck to the secondary plane of the light-emitting chip with its tip inserted to the guiding hole. Since the position of the guiding hole is aligned to that of the surface emitting laser, the optical fiber is coupled optically to the surface emitting laser.

In a third embodiment, an optical fiber module is fabricated with a method comprising the following steps. First, epitaxial layers constituting surface emitting lasers are grown on a semiconductor substrate. Then a part of the epitaxial layers grown on a fringe of the semiconductor substrate are etched and removed. Guiding holes and through holes are opened simultaneously on a secondary plane of the semiconductor substrate. The guiding holes are etched down to reach the bottom of the epitaxial layers. The through holes are also etched to the same depth though they are located at the fringe of the semiconductor substrate where the epitaxial layers are etched off. Accordingly, the through holes penetrate the semiconductor substrate.

Since the through holes can be observed from the primary plane, they can be used as alignment keys when the epitaxial layers are etched to form mesas of surface emitting lasers. The positions of the mesas are aligned precisely to the guiding holes because the relative positions between the guiding holes and the through holes are determined with a photomask used for opening both of the holes. The semiconductor substrate is then divided into light-emitting chips. Each of the light-emitting chips includes one or more surface emitting lasers. Finally, optical fibers are stuck to the secondary plane of the light-emitting chip with their tips inserted to the guiding holes. As a result, each of the optical fibers is coupled optically to one of the surface emitting lasers.

DETAILED DESCRIPTION OF THE INVENTION

Figure 1:
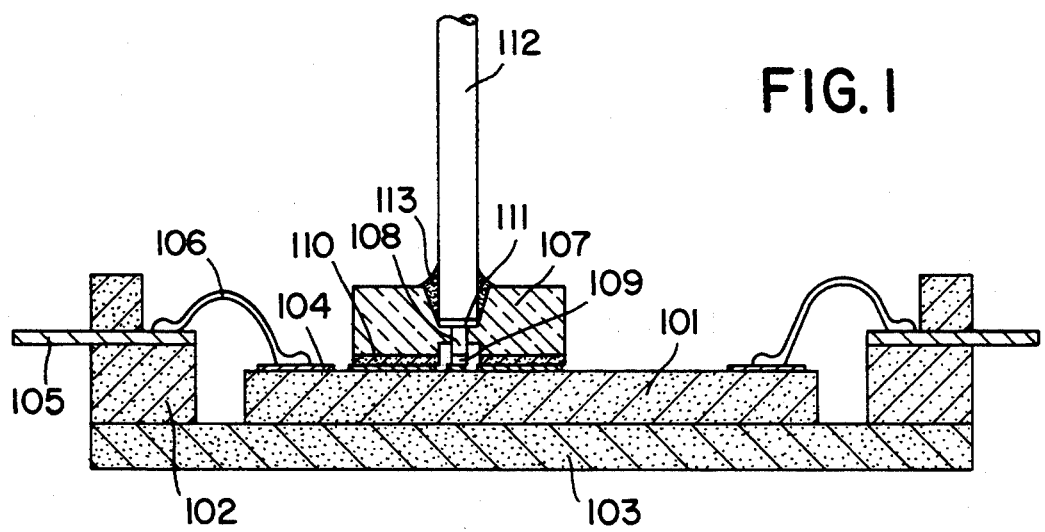
FIG. 1 is a sectional view of an optical fiber module according to one exemplary embodiment of the present invention.

FIG. 1 is a sectional view of an optical fiber module according to one exemplary embodiment of the present invention. An electronic circuit board 101 is a Si or GaAs IC chip bonded to a floor 103 of a package 102. Pads 104 on the electronic circuit board 101 are connected to leads 105 of the package 102 with wires 106. A vertical cavity surface emitting laser 108 is formed on a primary plane of the light-emitting chip 107. The light-emitting chip 107 is bonded to the electronic circuit board 101 with the primary plane attached to a partial region of the electronic circuit board 101. An anode 109 and a cathode 110 of the surface emitting laser 108 have electrical contacts connected independently to interconnection metals on the electronic circuit board 101. A guiding hole 111 is opened on a secondary plane of the light-emitting chip 107. An optical fiber 112 is inserted to the guiding hole 111, and fixed with adhesive 113. The adhesive is, for example, UV cured epoxy.

The position of the guiding hole 111 is aligned to that of the surface emitting laser 108. As a result, the optical fiber 112 is coupled optically to the surface emitting laser 108 by inserting a tip of the optical fiber 112 to the guiding hole 111. The alignment between the surface emitting laser 108 and the guiding hole 111 is achieved, for example, by using a method described in the third embodiment. In the first embodiment, the primary plane of the light-emitting chip 107 is attached to the electronic circuit board 101, while the optical fiber 112 is taken out from a secondary plane of the light-emitting chip 107. The assembly of the optical fiber module is simple since the optical fiber 112 can be coupled to the light-emitting chip 107 after the light-emitting chip 107 is attached to the electronic circuit board 101 bonded on a package 101.

Figure 2:
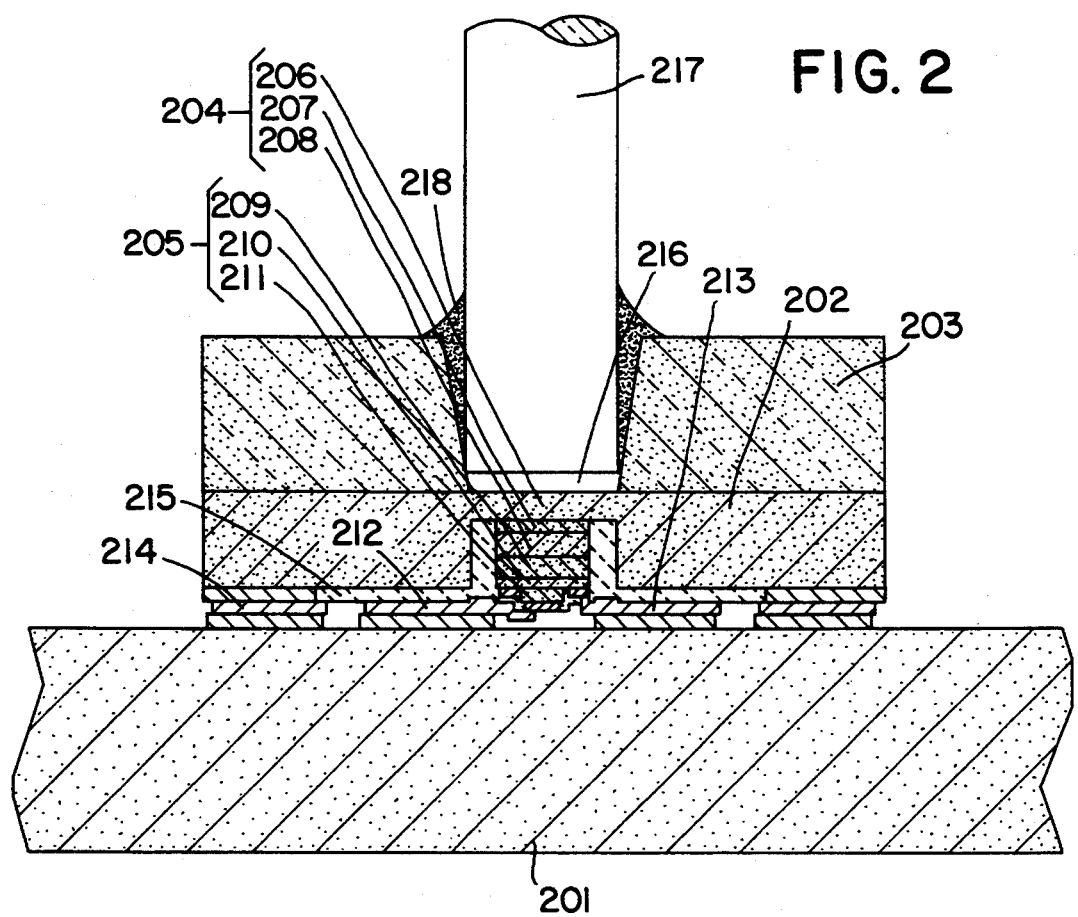
FIG. 2 is a sectional view of an optical fiber module according to a second embodiment of the present invention.

FIG. 2 is a sectional view of an optical fiber modules according to a second exemplary embodiment of the present invention. An electronic circuit board 201 is a printed board with interconnection metal patterns. A light-emitting chip 202 based on a semiconductor substrate 203 has a vertical cavity surface emitting laser 204 and a heterojunction bipolar transistor 205 on a primary plane. The surface emitting laser consists of a p-type mirror 206, an active layer 207, and an n-type mirror 208. The heterojunction bipolar transistor has a collector 209, a base 210, and an emitter 211. The light-emitting chip 202 is bonded to the electronic circuit board 201 with the primary plane attached to it.

The p-type mirror 206 of the surface emitting laser 204 is connected directly to the semiconductor substrate 203. The collector 209 of the heterojunction bipolar transistor 205 is connected directly to the n-type mirror 208 of the surface emitting laser 204. An emitter contact 212 and the base contact 213 of the heterojunction bipolar transistor 205, and an anodes 214 of the surface emitting laser 204 are formed on an insulator film 215 which is made of polyimide for example. They are connected electrically to the interconnection metals printed on the electronic circuit board 201. A guiding hole 216 is opened on a secondary plane of the light-emitting chip 202. An optical fiber 217 is inserted to the guiding hole 216, and fixed with adhesive 218.

Compared with the first embodiment, the second embodiment has merit that the modulation current for the surface emitting laser 204 can be reduced since the heterojunction bipolar transistor 205 amplifies the current. The modulation current is applied to the base contact 213, and the amplified current through the collector 209 drives the surface emitting laser 204. In regard to the optical alignment, the same configuration as the first embodiment is utilized. This is based on the fact that the heterojunction bipolar transistor 205 is stacked on the surface emitting laser 204, and a laser ray is emitted toward the semiconductor substrate 203. The alignment between the surface emitting laser 204 and the guiding hole 216 is achieved, for example, by using a method described in the third embodiment.

In the first and the second embodiments, only one surface emitting laser is illustrated in the figures though it is obvious that this invention can be applied to a light-emitting chip having plural surface emitting lasers. Optical fiber modules including several lasers in one package are very attractive for application to multichannel optical interconnection systems. The mechanical positioning of optical fibers offered by this invention is essentially effective in such optical fiber modules though it gives merit to single laser modules.

FIG. 3 is a sectional view of a method for fabricating an optical fiber modules according to a third exemplary embodiment of the present invention. As shown in FIG. 3(A), epitaxial layers 302 constituting surface emitting lasers are grown on a primary plane of a semiconductor substrate 301. The epitaxial layers 302 consists of a lower mirror 303 made of GaAs/AlAs multilayers with a first conduction type, an active layer 304 of InGaAs/GaAs, and an upper mirror 305 of GaAs/AlAs multilayers with a second conduction type. Then a part of the epitaxial layers 302 grown at a fringe of the semiconductor substrate are etched and removed as shown in FIG. 3(B).

Figure 3A:
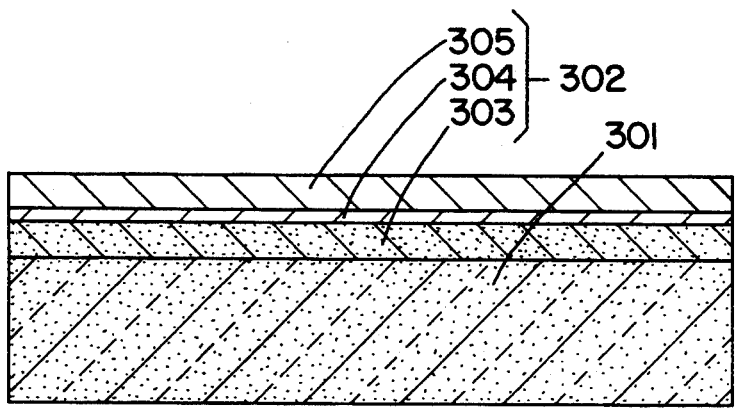
FIGS. 3A-E are sectional views illustrating a method for fabricating an optical fiber module according to a third embodiment of the present invention.
Figure 3B:
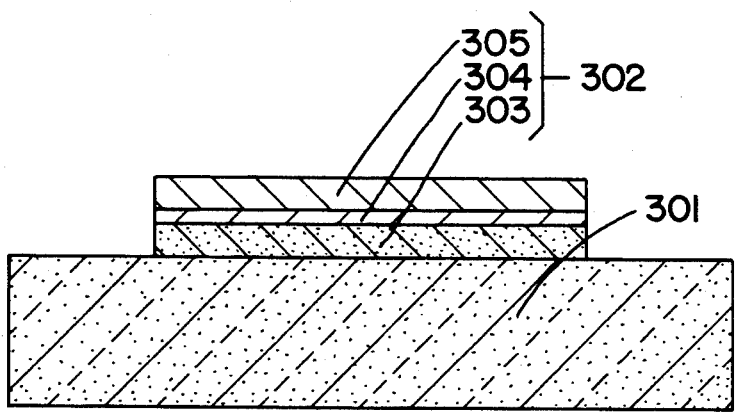
Figure 3C:
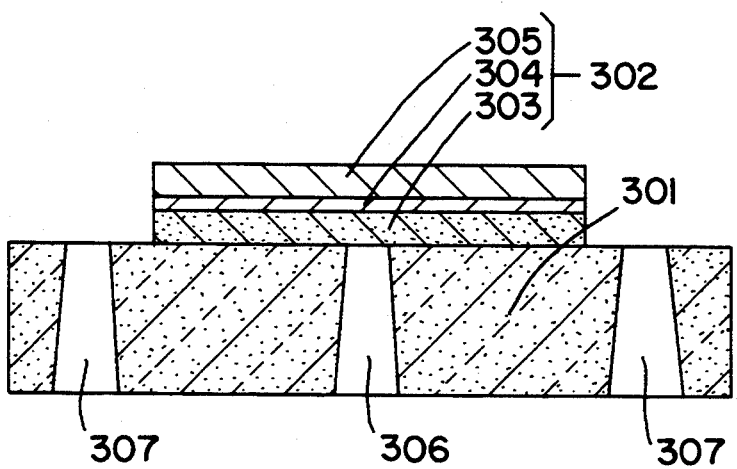
Figure 3D:
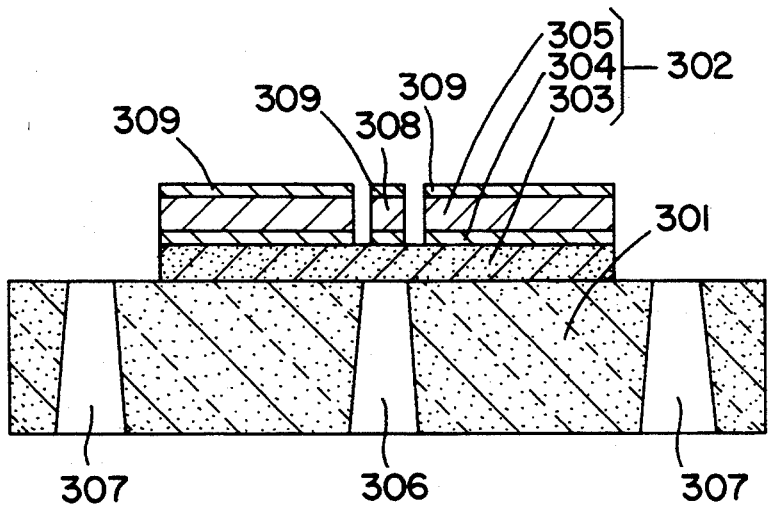

In FIG. 3(C), guiding holes 306 and through holes 307 are opened simultaneously on a secondary plane of the semiconductor substrate 301. In this figure, only one guiding hole 306 and two through holes 307 are illustrated though they are not limited to these numbers. Especially, the number of the guiding holes 306 is several thousand or more since it corresponds to the number of surface emitting lasers fabricated hereafter. The guiding holes 306 are etched down to reach the bottom of the lower mirror 303. Since the bottom layer of the lower mirror 303 is AlAs, etching can be easily stopped by using a preferential etchant. The through holes 307 penetrate the semiconductor substrate 301 with the same etching process since they are located at the fringe of the semiconductor substrate 301 where the epitaxial layers 302 are etched off.

Figure 3E:
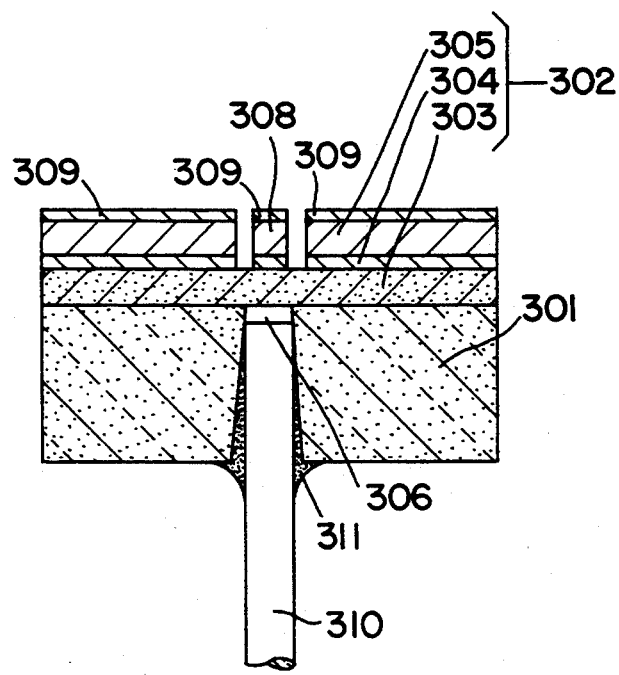
Figure 4:
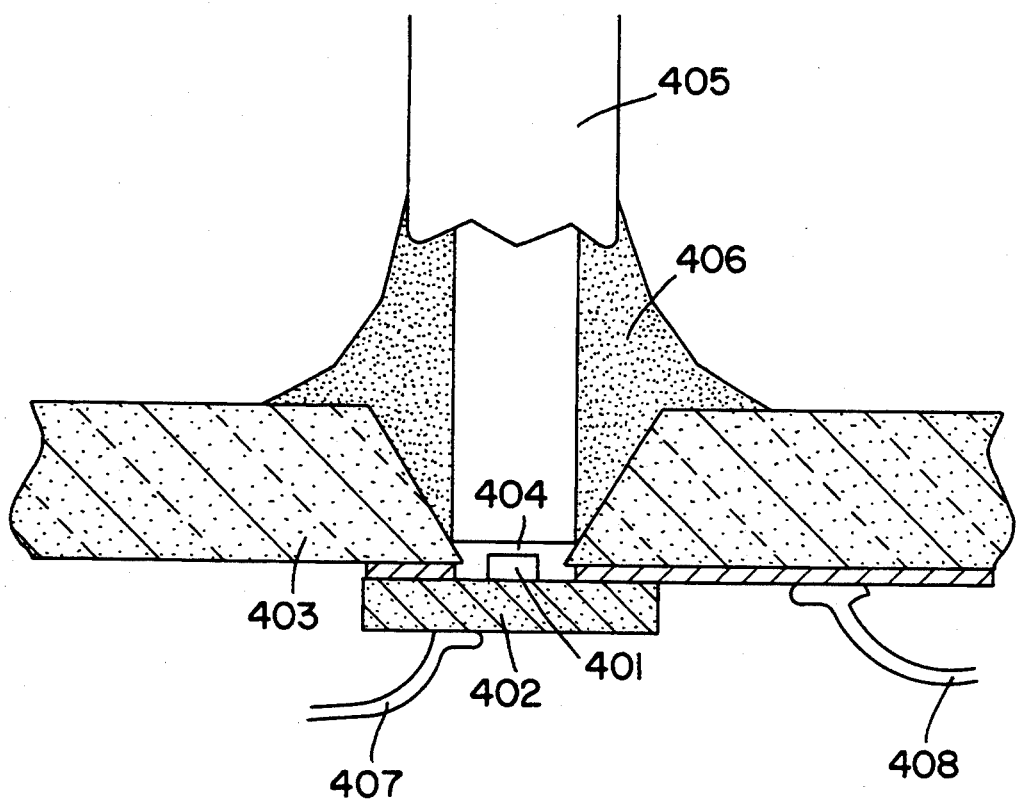
FIG. 4 is a sectional view of a conventional optical fiber module.

Since the through holes 307 can be observed from the primary plane, they can be used as alignment keys when the epitaxial layers 302 are etched to form mesas of surface emitting lasers 308 shown in FIG. 3(C). The mesas are formed by etching the upper mirror 305 and the active layer 304 through ring patterns opened in contact metals 309. The positions of the mesas are aligned precisely to the guiding holes because the relative positions between the guiding holes 306 and the through holes 307 are determined with a photomask used for opening both of the holes. Not illustrated in the figure, the semiconductor substrate 301 is then divided into light-emitting chips. Each of the light-emitting chip includes one or more surface emitting lasers 308. Finally, optical fibers 310 are stuck to the secondary plane of the light-emitting chip with their tips inserted to the guiding holes 306 as shown in FIG. 3(E). As a result, each of the optical fibers 306 is coupled optically to one of the surface emitting lasers 308.

In the third embodiment, the materials system for fabricating surface emitting lasers is described as In-GaAs/GaAs/AlAs though it is obvious that the method can be used also for other materials system, for example, GaAs/AlGaAs/AlAs or InGaAsP/InP.

What is claimed:

1. An optical fiber module with a surface emitting laser comprising:
   an electronic circuit board;
   a light-emitting chip, having first and second major faces, said light-emitting chip mounted on said electronic circuit board with said first major face attached to said electronic circuit board;
   a surface emitting laser formed on said first major face of said light-emitting chip, said surface emitting laser having an anode and cathode on said first major face, said anode and said cathode connected electrically to said electronic circuit board;
   a guiding hole formed on said second major face of said light-emitting chip, the position of said guiding hole aligned to the position of said surface emitting laser; and
   an optical fiber inserted into said guiding hole, said optical fiber coupled optically to said surface emitting laser.

2. An optical fiber module with a surface emitting laser according to claim 1, wherein said electronic circuit board is a semiconductor substrate.

3. An optical fiber module with a surface emitting laser according to claim 1, wherein said surface emitting laser is provided with a vertical cavity.

4. An optical fiber module comprising:
   an electronic circuit board;
   a light-emitting chip having a guiding hole, said light-emitting chip mounted on said electronic circuit board;
   a surface emitting laser buried in said light-emitting chip adjacent said guiding hole;
   a transistor having a collector directly connected on said surface emitting laser and an emitter and a base connected electrically to said electronic circuit board; and
   an optical fiber inserted into said guiding hole.

5. An optical fiber module according to claim 4, wherein said surface emitting laser includes a cathode which is connected directly to the collector of said transistor, and an anode which is connected electrically to said electronic circuit board.

6. An optical fiber module comprising:
   a semiconductor substrate having a guiding hole;
   a surface emitting laser buried in said semiconductor substrate and adjacent to said guiding hole;
   a transistor having a collector directly connected on said surface emitting laser and an emitter and a base disposed on a surface of said semiconductor substrate; and
   an optical fiber inserted into said guiding hole.

* * * * *